(12) United States Patent
Young et al.

(10) Patent No.: US 6,815,015 B2
(45) Date of Patent: Nov. 9, 2004

(54) JETTING BEHAVIOR IN THE LASER FORWARD TRANSFER OF RHEOLOGICAL SYSTEMS

(75) Inventors: Henry Daniel Young, College Park, MD (US); Raymond C. Y. Auyeung, Alexandria, VA (US); Bradley R. Ringeisen, Alexandria, VA (US); Douglas B. Chrisey, Bowie, MD (US); Dana D. Dlott, Champaign, IL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/237,072

(22) Filed: Sep. 9, 2002

(65) Prior Publication Data

US 2003/0017277 A1 Jan. 23, 2003

Related U.S. Application Data

(60) Continuation-in-part of application No. 10/141,820, filed on May 10, 2002, which is a continuation-in-part of application No. 10/068,315, filed on Feb. 8, 2002, which is a continuation-in-part of application No. 09/671,166, filed on Sep. 28, 2000, which is a division of application No. 09/318,134, filed on May 25, 1999, now Pat. No. 6,177,151.

(60) Provisional application No. 60/117,468, filed on Jan. 27, 1999, and provisional application No. 60/327,733, filed on Oct. 4, 2001.

(51) Int. Cl.[7] .................. C23C 14/30; C23C 14/28; B05D 3/00
(52) U.S. Cl. ............. 427/596; 427/595; 427/554; 427/555
(58) Field of Search ................ 427/596, 595, 427/554, 555, 597, 582, 583, 584, 553, 556

(56) References Cited

U.S. PATENT DOCUMENTS

| | | | |
|---|---|---|---|
| 3,745,586 A | | 7/1973 | Braudy |
| 4,987,006 A | * | 1/1991 | Williams et al. ............ 427/597 |
| 5,292,559 A | * | 3/1994 | Joyce et al. ................ 427/597 |
| 5,308,737 A | * | 5/1994 | Bills et al. ................... 430/201 |
| 5,741,560 A | * | 4/1998 | Ross ........................... 427/555 |
| 5,757,313 A | | 5/1998 | Meneghini et al. |
| 5,985,377 A | * | 11/1999 | Corbett ........................ 427/511 |
| 6,025,036 A | * | 2/2000 | McGill et al. .............. 427/492 |
| 6,159,832 A | * | 12/2000 | Mayer ........................ 438/584 |
| 6,177,151 B1 | * | 1/2001 | Chrisey et al. ............. 427/596 |
| 6,495,195 B2 | * | 12/2002 | Baer et al. ................. 427/2.11 |

OTHER PUBLICATIONS

Young et al, "Time–resolved optical microscopy of a laser-based forward transfer process", Applied Physics Letters, vol. 78 No. 21, May 21, 2001.

Ringeisen et al, "Generation of Viable Cell Active Biomaterial Patterns By Laser Transfer", U.S. patent application 10/068,315, filed Feb. 8, 2002, pp. 1–36.

Young et al, "Jetting Behavior in the Laser Forward Transfer of Rheological Fluids", Provisional application, 60/327,733 filed Oct. 10, 2001, pp. 1–46.

Meneghini et al, "Transfer Printing Medium", PCT International application, PCT/US94/11345, filed Oct. 6, 1994, pp. 1–22.

Auyeung et al, "Laser Forward Transfer of Rheological Systmes", U.S. patent application 10/141,820, filed May 10, 2002.

* cited by examiner

*Primary Examiner*—Shrive P. Beck
*Assistant Examiner*—Eric B. Fuller
(74) *Attorney, Agent, or Firm*—John J. Karasek; Joseph T. Grunkemeyer

(57) ABSTRACT

A method for laser transfer and deposition of a rheological fluid wherein laser energy strikes a target substrate comprising a rheological fluid, causing a portion of the rheological fluid to evaporate and propel a jet of non-evaporated rheological fluid onto a receiving substrate.

31 Claims, 4 Drawing Sheets

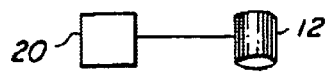
FIG. 1a
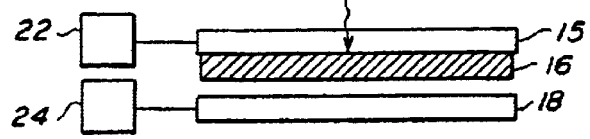
FIG. 1b
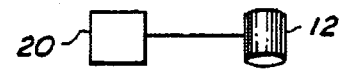
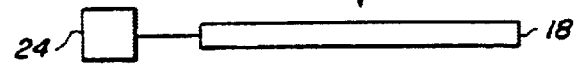
FIG. 2a
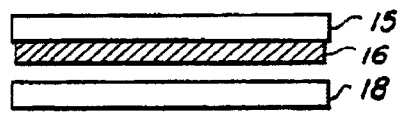
FIG. 2b
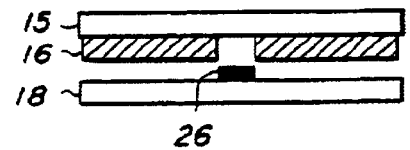
FIG. 3a
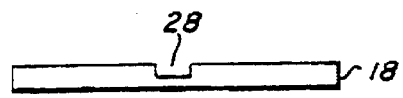
FIG. 3b
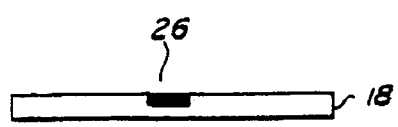

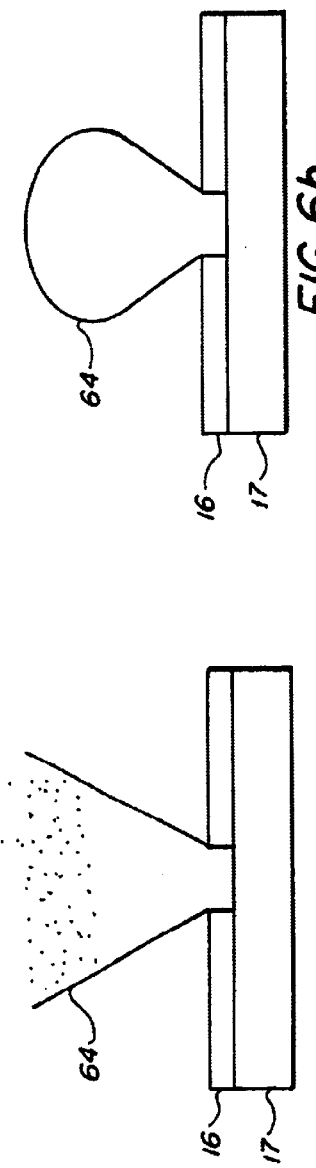
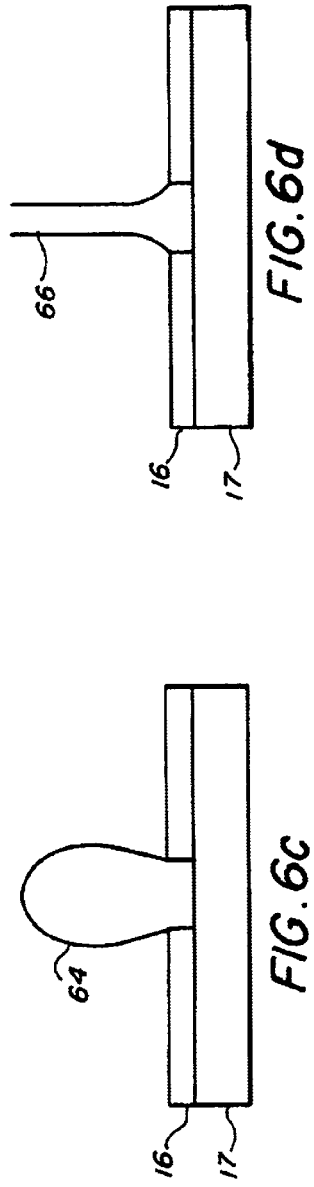
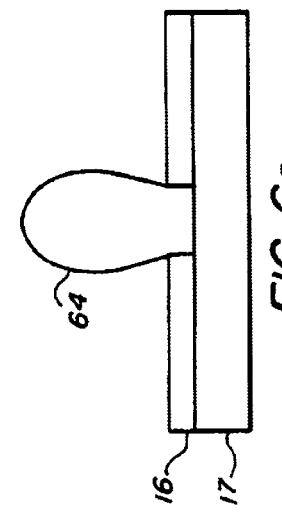
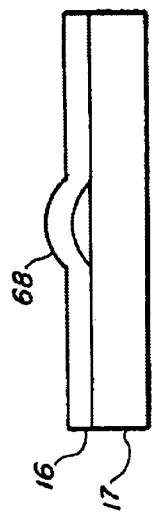

JETTING BEHAVIOR IN THE LASER FORWARD TRANSFER OF RHEOLOGICAL SYSTEMS

This nonprovisional application is a continuation-in-part application of U.S. patent application Ser. No. 10/141,820 filed on May 10, 2002, which is a continuation-in-part application of U.S. patent application Ser. No. 10/068,315 filed on Feb. 8, 2002, which is a continuation-in-part application of U.S. patent application Ser. No. 09/671,166 filed on Sep. 28, 2000, which is a divisional application of U.S. Pat. No. 09/318,134, now U.S. Pat. No. 6,177,151 filed on May 25, 1999, which claims benefit of U.S. provisional patent application No. 60/117,468 filed on Jan. 27, 1999. This application also claims benefit of U.S. provisional patent application No. 60/327,733 filed on Oct. 4, 2001 as to certain matter. All applications and patents named above are incorporated herein by reference.

BACKGROUND OF THE INVENTION

1. Field of the Invention

The invention relates generally to a laser transfer method for the deposition of a jet of a rheological fluid or system onto a substrate.

2. Description of the Prior Art

A direct-write process is a technique which allows the creation of a pattern and the transfer of material simultaneously onto a given surface or substrate. To be most useful, it does not require any masks or pre-existing form and is usually done under ambient temperature and pressure conditions. Direct-write technologies have been developed in response to a need in the electronics industry for a means to rapidly prototype passive circuit elements on various substrates, especially in the mesoscopic regime, that is, electronic devices that straddle the size range between conventional microelectronics (sub-micron-range) and traditional surface mount components (10+ mm-range). (Direct-writing may also be accomplished in the sub-micron range using electron beams or focused ion beams, but these techniques, because of their small scale and vacuum requirements, are not appropriate for large-scale rapid prototyping.) Direct-writing allows for circuits to be prototyped without iterations in photolithographic mask design and allows the rapid evaluation of the performance of circuits too difficult to accurately model. Further, direct-writing allows for the size of printed circuit boards and other structures to be reduced by allowing passive circuit elements to be conformally incorporated into the structure. Direct-writing can be controlled with CAD/CAM programs, thereby allowing electronic circuits to be fabricated by machinery operated by unskilled personnel or allowing designers to move quickly from a design to a working prototype. Mesoscopic direct-write technologies have the potential to enable new capabilities to produce next generation applications in the mesoscopic regime. Other applications of direct-write technologies in microelectronic fabrication include forming ohmic contacts, forming interconnects for circuit and photolithographic mask repair, device restructuring and customization, design and fault correction.

Currently known direct-write technologies for adding materials to a substrate include ink jet printing, Micropen, laser induced forward transfer (LIFT), laser chemical vapor deposition (LCVD), laser particle guidance (Optomec, Inc.), and laser engineered nano-shaping (LENS). Currently known direct-write technologies for removing material from a substrate include laser machining, laser trimming, and laser drilling.

The direct-writing techniques of ink jet printing, screen-printing, and Micropen are wet techniques, that is, the material to be deposited is combined with a solvent or binder and is applied onto a substrate. In the case of ink jet printing, inks with very low viscosity are required so that they can be forced through nozzles via mechanical or thermal forces. In the case of screen-printing and Micropen, inks with relatively high viscosities are required so as to minimize their spreading once applied to the substrate. The solvent or binder must later be removed by a drying or curing process, which limits the flexibility and capability of these approaches. In all these techniques, only inks within a narrow range of viscosity can be used and therefore the choices of materials or formulations that can be transferred are rather limited.

In the direct-writing technique known as "laser induced forward transfer" (LIFT), a pulsed laser beam is directed through a laser-transparent target substrate to strike a film of material coated on the opposite side of the target substrate. The laser vaporizes the film material as it absorbs the laser radiation and, due to the transfer of momentum, the material is removed from the target substrate and is redeposited on a receiving substrate that is placed in proximity to the target substrate. Laser induced forward transfer is typically used to transfer opaque thin films, typically metals, from a pre-coated laser transparent support, typically glass, $SiO_2$, $Al_2O_3$, $SrTiO_3$, etc., to the receiving substrate. Various methods of laser-induced forward transfer are described in, for example, the following U.S. patents and publications incorporated herein by reference: U.S. Pat. No. 4,752,455 to Mayer, U.S. Pat. No. 4,895,735 to Cook, U.S. Pat. No. 5,725,706 to Thoma et al., U.S. Pat. No. 5,292,559 to Joyce, Jr. et al., U.S. Pat. No. 5,492,861 to Opower, U.S. Pat. No. 5,725,914 to Opower, U.S. Pat. No. 5,736,464 to Opower, U.S. Pat. No. 4,970,196 to Kim et al., U.S. Pat. No. 5,173,441 to Yu et al., and Bohandy et al., "Metal Deposition from a Supported Metal Film Using an Excimer Laser, J. Appl. Phys. 60 (4) Aug. 15, 1986, pp 1538–1539. Because the film material is vaporized by the action of the laser, laser induced forward transfer is inherently a pyrolytic technique used to deposit simple one-component materials and typically cannot be used to deposit complex crystalline, multi-component materials as they tend to decompose when vaporized and may become amorphous upon condensation. Moreover, because the material to be transferred is vaporized, it becomes more reactive and can more easily become degraded, oxidized, or contaminated. The method is not well suited for the transfer of organic materials, since many organic materials are fragile, thermally labile, and can be irreversibly damaged during deposition. Moreover, functional groups on an organic polymer can be irreversibly damaged by direct exposure to laser energy. Other disadvantages of the laser induced forward transfer technique include poor uniformity, morphology, adhesion, and resolution. Further, because of the high temperatures involved in the process, there is a danger of ablation or sputtering of the support, which can cause the incorporation of impurities in the material that is deposited onto the receiving substrate. Another disadvantage of laser induced forward transfer is that it typically requires that the coating of the material to be transferred be a thin coating, generally less than 1 $\mu$m thick. Because of this requirement, it is very time-consuming to transfer large amounts of material. Finally, LIFT was not designed originally for the transfer of rheological systems. The art of applying a solid coating to the target substrate was already well established in the field and a rheological coating as described in this invention would have added extra complexity to its manufacture, use, and storage.

In a simple variation of laser induced forward transfer, the target substrate is coated with several layers of materials. The outermost layer, that is, the layer closest to the receiving substrate, consists of the material to be deposited and the innermost layer consists of a material that absorbs laser energy and becomes vaporized, causing the outermost layer to be propelled against the receiving substrate. Variations of this technique are described in, for example, the following U.S. patents and publications incorporated herein by reference: U.S. Pat. No. 5,171,650 to Ellis et al., U.S. Pat. No. 5,256,506 to Ellis et al., U.S. Pat. No. 4,987,006 to Williams et al., U.S. Pat. No. 5,156,938 to Foley et al. and Tolbert et al., "Laser Ablation Transfer Imaging Using Picosecond Optical pulses: Ultra-High Speed, Lower Threshold and High Resolution" Journal of Imaging Science and Technology, Vol.37, No.5, September/October 1993 pp.485–489. A disadvantage of this method is that, because of the multiple layers, it is difficult or impossible to achieve the high degree of homogeneity of deposited material on the receiving substrate required, for example, in the construction of electronic devices, sensing devices or passivation coatings. In addition, the multiple layers tend to leave residues that may contaminate the transferred material or degrade its properties.

The direct-write technique called laser chemical vapor deposition (LCVD) utilizes a laser beam focused on the surface of a substrate to induce localized chemical reactions. Usually the surface of the substrate is coated with a metalorganic precursor, which is either pyrolyzed or photolyzed locally where the laser beam scans. Pyrolytic LCVD involves essentially the same mechanism and chemistry as conventional thermal LCVD, and it has found major use in direct-writing of thin films for semiconductor applications. In photolytic LCVD, the chemical reaction is induced by the interaction between the laser light and the precursors. A limitation of both processes is that they must be carried out under controlled atmospheres such as inside a vacuum system, and they tend to exhibit slow deposition rates. In addition they are not well suited for direct-write applications where multilayers of dissimilar types of materials need to be produced.

The direct-write technique called laser engineered nano-shaping (LENS) utilizes a laser beam to melt powders of various materials as they come in contact with the substrate surface. LENS is a process that works well for making thick layers of metals. However, the high melting points exhibited by most ceramics required the use of high power laser beams, which cause the overheating of the substrate and surrounding layers. Furthermore, many ceramics once melted will not exhibit their original crystalline structure after solidification. In addition, because the materials being deposited must first melt and then resolidify, the layers are under large stresses, which cause their delamination.

All these techniques involve the laser transfer of matter that is not deliberately subject to any type of deformation or flow. Rather, the matter is subject either to changes in phase, i.e. solid to vapor or to change in composition, i.e. decomposition of a matrix. At present there is no record of the use of lasers to forward transfer rheological systems, i.e. fluids, gels, or pastes, taking advantage of the rheological properties, for the purpose of laser direct-write applications.

The wet techniques described above cannot make a pattern with a resolution on the order of a few microns. The laser transfer techniques described above cannot be used with a rheological fluid. There remains a need for a laser transfer method that can produce a pattern of a rheological fluid with a resolution on the order of a few microns.

U.S. Pat. No. 6,177,151 to Chrisey et al. discloses the MAPLE-DW (Matrix Assisted Pulsed Laser Evaporation Direct-Write) method and apparatus. The method comprises the use of laser energy to cause a composite material to volatilize, desorb from a laser-transparent support, and be deposited on a receiving substrate. The composite material comprises a matrix material and a transfer material. The transfer material is the material desired to be transferred to the receiving substrate. The matrix material is more volatile than the transfer material and binds the transfer material into the composite material. The laser energy causes the matrix material to volatilize and propel the transfer material onto the receiving substrate. The properties of the transfer material are preserved after deposition. This method will be further described in the Detailed Description of the Preferred Embodiments below. U.S. Pat. No. 6,177,151 is primarily directed to the transfer of solid composite materials.

U.S. patent application Ser. No. 10/141,820 to Auyeung et al., filed on May 8, 2002, discloses the use of MAPLE-DW when the matrix material is a rheological fluid. Auyeung et al. did not disclose a method of transferring the rheological fluid by a jetting regime.

SUMMARY OF THE INVENTION

It is an object of the invention to provide methods for depositing a rheological fluid on a receiving substrate using a laser forward transfer apparatus that can produce a pattern with a resolution on the order of a few microns.

It is a further object of the invention that the method use laser fluences lower than that required by other laser transfer methods.

It is a further object of the invention that the method allow for higher density and linewidth definition in the transferred material.

It is a further object of the invention to provide a method that produces jetting behavior in the transferring rheological fluid.

It is a further object of the invention to use jetting to produce an area of deposit much smaller than the area of the incident laser energy.

These and other objects of the invention are accomplished by a method for laser deposition comprising the steps of: providing a receiving substrate; providing a target substrate; wherein the target substrate comprises a laser-transparent support coated with a coating on a surface facing the receiving substrate; and exposing the coating to laser energy through the laser-transparent support at a defined target location comprising a rheological fluid to evaporate a portion of the rheological fluid adjacent to the laser-transparent support at the defined target location; wherein the laser energy has a laser fluence that is chosen to cause jetting behavior in the non-evaporated rheological fluid; wherein the non-evaporated rheological fluid at the defined target location is propelled by the evaporated rheological fluid away from the laser-transparent support and toward the receiving substrate; and wherein the non-evaporated rheological fluid is deposited at a defined receiving location on the receiving substrate to form a deposit.

BRIEF DESCRIPTION OF THE DRAWINGS

FIG. 1a is a schematic representation of a MAPLE-DW apparatus when used to transfer a coating 16 comprising a rheological fluid to a receiving substrate 18.

FIG. 1b is a schematic representation of the MAPLE-DW apparatus when used to micromachine away or laser-surface-treat a portion of the receiving substrate 18 or the deposit 26.

FIGS. 2a and 2b are schematic representations of the laser-transparent support 15, the coating 16, and the receiving substrate 18 before (2a) and after (2b) the depositing of the rheological fluid on the receiving substrate 18 to form a deposit 26.

FIGS. 3a and 3b are schematic representations of a defined machining location 28 on a receiving substrate 18 (3a) made using the apparatus of FIG. 1b, and a deposit 26 in a defined machining location 28 (3b) made using the apparatus of FIG. 1a.

FIGS. 6a–e schematically illustrate various morphologies of rheological fluid as it is propelled away from the target substrate 17.

Figure 4:
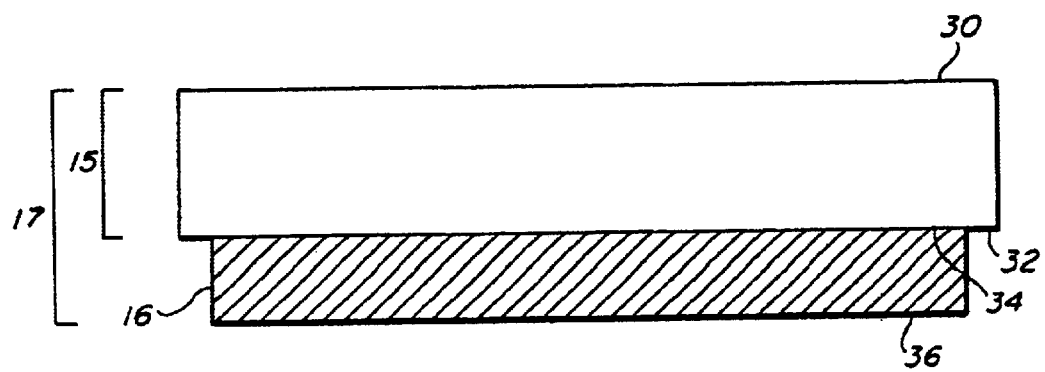
FIG. 4 is a detailed schematic representation of a target substrate 17 showing the laser-transparent support 15, and composite material 16.

LIST OF REFERENCE NUMBERS 12 laser
14 laser energy
15 laser-transparent support
16 coating
17 target substrate
18 receiving substrate
20 laser positioning means
22 target substrate positioning means
24 receiving substrate positioning means
26 deposit
28 defined machining location
30 rear surface
32 support surface
34 back surface
36 front surface
40 microscope
42 charge coupled device (CCD) camera
44 computer and video frame grabber
46 delay generator
48 transfer laser
50 illumination laser
54 objective or lens
56 plume
58 strobe pulse (<1 ns)
60 laser energy (30 ns)
62 optical fiber
64 plume
66 jet
68 bulge

DETAILED DESCRIPTION OF THE PREFERRED EMBODIMENTS

Basic Method

FIG. 1a schematically illustrates a MAPLE-DW apparatus used in the present invention. The apparatus includes a source of laser energy 12 that produces laser energy 14, a target substrate 17, and a receiving substrate 18. Typically, the receiving substrate 18 is positioned opposite the source of laser energy 12. Typically, the target substrate 17 is positioned between the receiving substrate 18 and the source of laser energy 12. FIG. 4 schematically illustrates the target substrate in detail. The target substrate 17 comprises two layers: a laser-transparent support 15 and a coating 16. The laser-transparent support 15 has a support surface 32 that faces the receiving substrate 18 and a rear surface 30 on the opposite side of the laser-transparent support 15 from the support surface 32. The coating 16 has a back surface 34 in contact with the support surface 32 and a front surface 36 facing the receiving substrate 18.

The method of the invention for laser deposition comprises the steps of: providing a receiving substrate 18, providing a target substrate 17, and exposing the coating 16 to laser energy 14.

In the step of exposing the coating 16, laser energy 14 passes through the laser-transparent support 15 to strike the coating 16 at a defined target location. The coating 16 at the defined target location comprises a rheological fluid. A rheological fluid or system as used herein refers to a class of materials that exhibits phenomena lying in a range between that of a solid and a liquid. A rheological material is characterized by at least one fundamental rheological property such as elasticity or viscosity. The types of rheological materials referred herein include, but are not limited to, gels, pastes, inks, concentrated solutions, suspensions, Newtonian and non-Newtonian fluids, viscoelastic solids (elastic solids which exhibit some viscous effects) and elasticoviscous fluids (viscous fluids which show some elastic behavior). Hereafter, a "fluid" or a "rheological fluid" is equivalent to a "rheological system" as defined above.

The laser energy 14 has sufficient energy to locally heat a very small volume of the rheological fluid adjacent to the support surface 32, vaporizing a small amount of the rheological fluid. This evaporated rheological fluid generates a high-pressure burst that propels the non-evaporated rheological fluid at the defined target location across the gap between the target substrate 17 and the receiving substrate 18. In this fashion the rheological fluid is transferred over the surface of the receiving substrate 18 at a defined receiving location over an area proportional to the area illuminated on the target substrate 17 by the laser energy 14. The transferred rheological fluid on the receiving substrate 18 is referred to as a deposit 26.

Unless otherwise stated, all steps can be performed in any sequence that results in a deposit 26 on the receiving substrate 18. Typically, the method is controlled by a computer, including the firing of the laser and the positioning of the components. Typically, the method is carried out at about room temperature and about atmospheric pressure. The method can also be carried out within an enclosure with controlled gases and pressures.

FIGS. 2a and 2b schematically illustrate the effects of exposing the target substrate to the laser energy 14, whereby the rheological fluid is propelled from the surface of the target substrate 17 and deposited onto the receiving substrate 18 forming the deposit 26.

The use of rheological materials with this technique allows almost any functional material in the form of powders, flakes, or other particles to be integrated into a system with the correct rheology for proper laser transfer and deposition of high-quality materials. The method is compatible with pastes, gels, and inks used for the screen printing, ink-jetting, etc. of discrete and active or passive electronic devices such as interconnects, vias, transmission lines, capacitors, resistors, inductors, antennae, sensors, transducers, three- and four-terminal devices, etc.

The use of laser forward transfer of rheological fluids offers many advantages. The method can produce patterns with superior electronic properties. Very small volumes of fluids (in the picoliter range) can be deposited with high resolution (in the 10's of microns). Layers composed of mixtures of solids and liquid phases in the form of homogenous dispersions can be deposited. Structures with unique density distributions can be made by utilizing the rheological properties of the transferred fluid. The use of lasers offers the advantages of high speed, well-defined spatial and temporal control, and a highly concentrated energy source whose properties (e.g. wavelength, fluence, intensity, and polarization) can be tailored to the properties of the rheological system. The method uses laser fluences generally lower than those required by other laser transfer processes, such as LIFT. This results in little or no laser damage to the functional material. The method can solve problems such as adhesion, debris, and conformal coverage by the rheological fluid by virtue of the ability of the fluids to adhere to, cover, and fill any type of surface, due to tailored rheological properties. Complete merging of the separately transferred adjacent deposits can be obtained. The method also allows for higher density and linewidth definition in the transferred material due to the improved and higher packing density of powders in a rheological fluid.

Additional Exposures

The method can comprise an additional step that enables the use of coatings 16 that are not necessarily as desirable for use in the basic method. Such coatings 16 comprise materials referred to as rheology precursors. A rheology precursor is a material whose initiation, degree, and duration of desired rheological properties (e.g. viscosity) can be activated by an external stimulus as required. The rheology precursor may or may not be a rheological fluid, but it typically does not have the desired or optimal rheological properties for laser transfer. A first exposure converts the rheology precursor to the rheological fluid, and a second exposure transfers the rheological fluid to the receiving substrate 18. The two exposures may be produced by a single laser 12 or by two different lasers 12.

The additional step is exposing the coating 16 to laser energy 14 through the laser-transparent support at the defined target location comprising a rheology precursor such that the rheology precursor is converted to the rheological fluid. The rheological fluid can then be transferred to the receiving substrate 18 as described above.

The uses of the dual exposure approach include, but are not limited to, two cases. In the first case, the rheology precursor is a primary component of the coating 16 on the laser-transparent support 15. It may only be able to be coated onto the target substrate 17 in a highly viscous form. The first exposure heats the rheology precursor at the defined target location to lower its viscosity so that it becomes a rheological fluid with desired rheological properties. The second exposure strikes the rheological fluid at the same defined target location, and is able to transfer the rheological fluid onto the receiving substrate 18 with better definition and higher density due to its lowered viscosity.

In the second case, the rheology precursor can be a material added and distributed uniformly throughout the coating 16. Upon first laser exposure, the desired rheology of the rheology precursor and therefore coating would be "activated" before transfer to the receiving substrate 18. For example, the coating 16 may first be made as a solid layer containing a rheology precursor, for example terpineol crystals, dispersed throughout. The first exposure will locally melt the terpineol crystals thereby changing the local rheological properties. The second exposure transfers this local rheological system to the receiving substrate 18. This method allows the desired rheological properties of the coating 16 to be activated only when needed and minimizes undesired long-term changes in rheology of the overall coating 16 on the target substrate 17 thus extending its shelf-life.

Regardless of whether the coating 16 initially comprises a rheological fluid or a rheology precursor, the method can comprise an additional step of exposing the deposit 26 to laser energy 14. The laser energy 14 alters the properties (including, but not limited to, rheology) of the deposit 26. (For example, see U.S. patent application Ser. No. 09/619, 442, incorporated herein by reference.) The two exposures may be produced by a single laser 12 or by two different lasers 12. This step can comprise laser trimming for the removal of excess material and modifying the final pattern. The technique of laser trimming is known in the art.

Micromachining

An additional step can be performed to micromachine away portions of the receiving substrate 18. This can be done by exposing the receiving substrate 18 to laser energy 14 to machine away a defined machining location 28 on the receiving substrate 18. This can be done before and/or after the transfer of the rheological fluid. FIG. 1b schematically illustrates the apparatus used to carry out this method. The laser energy 14 directly strikes the receiving substrate 18 without a target substrate 17 in between. This can be done with the same laser 12 as is used for exposing the rheological fluid, or a different laser 12. FIG. 3a schematically illustrates the resulting defined machining location 28 on the receiving substrate 18.

An additional step can be used to micromachine away portions of the deposit 26. This can be done by exposing the deposit 26 to laser energy 14 to machine away a defined machining location 28 on the deposit 26. This is essentially the same method as above except that it occurs after the deposit 26 is on the receiving substrate 18.

The above micromachining methods can also be used to micromachine a via, or small hole, all the way through the receiving substrate 18. Micromachining can also be used to make a trench on or through the receiving substrate, an elevated feature on the receiving substrate, and a depressed feature on or through the receiving substrate 18. Micromachining is also useful for laser-surface-treating the receiving substrate 18 or deposit 26. Such treatments include, but are not limited to, roughening and creating contours. In another embodiment, the rheological fluid is deposited directly into a defined machining location 28 already micromachined away by laser energy 14. FIG. 3b schematically illustrates the resulting deposit 26 in a defined machining location 28 on the receiving substrate 18.

Laser

Any suitable laser 12 may be used in the present invention. The term "laser" can refer to any device that produces laser energy 14. Typically, the laser 12 is a source of coherent electromagnetic energy generated by any means known in the art. Lasers 12 for use in accordance with the present invention can be any type generally used with other types of laser deposition. In general, a pulsed laser is preferred. A continuous wave laser is also suitable. A pulsed laser has the advantage of generating a very short burst of laser energy 14 that avoids damage to the coating 16. Pulsed lasers are commercially available within the full spectral range from UV to IR. Typically, such lasers emit light having a wavelength in the range of about 157–10600 nm, a pulsewidth of about $10^{-12}$–$10^{-6}$ second and a pulse repetition frequency of about 0 to greater than 100,000 Hz. Examples of suitable lasers 12 include, but are not limited to, excimer lasers operating at 193 and 248 nm and frequency quadrupled or tripled Nd:YAG laser operating at 266 and 355 nm. The fluence of the laser energy 14 is chosen such as to be sufficient to evaporate a small fraction of rheological fluid at the support surface/back surface 32/34 interface without causing the rest of the coating 16 to heat up above its drying temperature. Typical laser fluences range from about 0.01 to about 1 J/cm$^2$.

The dimensions of the laser energy 14 can be controlled by any means known in the art so that only a precisely defined area of the target substrate 17 is exposed to the laser energy 14 and so that only a precisely defined portion of the coating 16 is exposed. The laser energy 14 can be focused through an objective or lens to narrow the beam and expose a smaller portion of coating 16. This increases the possible resolution of the deposit 26.

Positioning of Components

The receiving substrate 18 should be positioned so that when the rheological fluid is propelled from the laser-transparent support 15, the rheological fluid is deposited at a defined receiving location on the receiving substrate 18. It may be desirable to provide enough space between the target substrate 17 and the receiving substrate 18 so that volatilized rheological fluid can escape from the space between the target substrate 17 and the receiving substrate 18. Typically, the receiving substrate 18 is positioned about 10 to about 100 μm from the surface of the coating 16.

Typically, the laser 12, receiving substrate 18, and target substrate 17 are positioned through the use of one or more positioning means selected from the group consisting of a laser positioning means 20, a target substrate positioning means 22, and a receiving substrate positioning means 24. These positioning means allow for selecting the defined target location, defined receiving location, and defined machining location 28. They can be any positioning means known in the art for supporting a laser 12, a target substrate 17, and a receiving substrate 18 and moving them in a controlled and defined manner. For example, similar positioning means and moving means for a laser, target substrate, and receiving substrate are known in the fields of laser transfer deposition and laser induced forward transfer. The laser 12 may be positioned in any location that provides an optical path between the laser 12 and the target substrate 17 so that sufficient laser energy 14 can be directed to the defined target location on the target substrate 17. It is not always necessary to use all three positioning means. It is only necessary to control the relative positions of the components such that the laser energy 14 strikes the coating 16 at the desired defined target location, and the rheological fluid is deposited on the receiving substrate 18 at the desired defined receiving location.

Transfer of Patterns

To transfer a pattern, the laser 12, target substrate 17, and the receiving substrate 18 should be moveable with respect to each other. It should be arranged so that rheological fluid can be deposited in a pattern. After the rheological fluid is transferred from one defined target location on the target substrate 17, the laser energy 14 can be directed to another defined target location on the target substrate 17 from which the rheological fluid has not yet been transferred. The rheological fluid can be deposited in a two-dimensional pattern or a three-dimensional pattern of deposit 26. This is done by repeating the step of exposing the coating 16 at successive defined target locations and successive defined receiving locations. This creates multiple instances of deposit 26 that can be placed in any two-dimensional pattern or three-dimensional pattern desired. A three-dimensional pattern can be created by placing deposit 26 on top of deposit 26 already on the receiving substrate 18.

To increase the thickness of deposit 26 at a particular defined receiving location, the laser 12 and the receiving substrate 18 are held stationary with respect to each other and the target substrate 17 is moved with respect to the laser 12 and the receiving substrate 18. The laser energy 14 is directed to a new defined target location on the target substrate 17 from which the rheological fluid has not yet been transferred. The rheological fluid is deposited onto the same defined receiving location on the receiving substrate 18 in an increasingly thickened deposit 26. (As used herein, the terms "moving [a] with respect to [b]" or "moving [a] and [b] with respect to each other" mean that either [a] or [b] can be moved to effect a change in their relative position.)

In another embodiment the step of providing a target substrate 17 is performed one or more times. The target substrates comprise at least two different coatings 16. The coatings 16 can comprise any combination of rheological fluids or rheology precursors. The different rheological fluids obtained from the different coatings 16 are deposited in respective patterns on the receiving substrate. With this method two or more rheological fluids can be combined on one receiving substrate 18 in any desired combination of patterns. The apparatus of the present invention can be adapted so that a plurality of different rheological fluids can be deposited consecutively onto a receiving substrate 18 by consecutively moving each target substrate 17 into a position for depositing rheological fluid from a particular target substrate 17 onto the receiving substrate 18. Consecutive deposition of different rheological fluids can also be accomplished by providing a target substrate 17 that is subdivided into a plurality of different subregions that each have a different coating 16 and providing a way to select a particular subregion and deposit the rheological fluid from that subregion onto the receiving substrate 18. This allows the deposition of multi-component structures on the receiving substrate 18.

Jetting Transfers

Under specific laser beam parameters, rheological fluid properties, and rheological fluid layer dimensions, it is possible to induce a thin, tightly confined jet of rheological fluid that propagates off the target substrate 17. When this "jetting regime" of rheological laser forward transfer is realized, the fluid jet can propagate for relatively long distances from the target substrate 17 while maintaining its jet shape.

This technique has a number of advantages. Firstly, finer resolution in the transferred deposit 26 can be achieved. A single laser exposure will transfer a certain amount of rheological fluid from the coating 16 to the receiving substrate 18. This material will cover a certain area of the receiving substrate 18, and this deposit 26 is known as a "voxel" (volume element). The transfer of multiple voxels will form a desired pattern on the receiving substrate 18. The size (area or diameter) of the voxel is important in determining the resolution of the writing system. When the rheological fluid strikes the receiving substrate 18 as a jet, the thin profile of the jet causes a much smaller diameter voxel of deposit 26 on the receiving substrate 18. Use of jetting laser forward transfer allows substantially improved resolution, over that of non-jetting transfers.

Secondly, the long propagation lengths of the fluid jet will also decrease mechanical tolerance specifications in the final apparatus. The fluid jet has been directly observed to maintain its column-like shape for up to several hundred microns and the limit could be much longer, perhaps even millimeters. So long as the jet structure is present when the material finally impacts the receiving substrate 18, the size of the resulting voxel will be almost or completely independent of the actual target substrate-receiving substrate 17, 18 separation. This allows a high degree of flexibility in positioning the substrates, and the substrates can be separated by much greater distances than in a non-jetting transfer. The primary advantages of this are in mechanical tolerances. In rheological forward transfer, the coating 16 and the receiving substrate 18 should not come into contact with each other, otherwise unwanted transfer of rheological fluid may result. Also, close proximity (usually <100 microns) between the coating 16 and the receiving substrate 18 is required for non-jetting transfers. In this configuration, any particulate contamination such as grit, dust, or fiber particles is very likely to cause significant disturbance of the writing process, such as unwanted transfer, smearing of written patterns, or disruption of the coating 16. Using the jetting regime, the mechanical separation between the coating 16 and receiving substrate 18 can be relaxed in order to mitigate these problems. Another advantage is that jetting transfer can be used in much "dirtier" manufacturing environments because of the decreased sensitivity of the writing process to contamination. Finally, equipment with lower tolerance specifications can be used in a jetting transfer system, thereby reducing costs.

Finally, the use of jetting transfers allows the transfer of a wider group of materials. The jetting regime is a much more gentle process then non-jetting transfers. The jetting regime allows transfer across longer distances with less laser power. The acceleration and velocity of the fluid is less, resulting in less pressure and shear forces in the propelled rheological fluid. The breakup of the propelled rheological fluid in particles is greatly reduced. These effects can be important advantages for the transfer of fragile materials. For example, biomaterials can be very fragile. During laser transfer, cells can be killed by compression or ruptured by shearing forces or fluid breakup. Both bio-molecules and cells can degrade upon exposure to intense laser light. Using laser-induced jets can reduce these problems.

Generally, there is a threshold level of laser fluence. Below the threshold, only a very small amount of rheological fluid is evaporated. This may be enough to cause a bulge in the surface of the coating 16, but the bulge collapses without any transfer of rheological fluid. At fluences above the threshold, there is a transfer. The shape of the propelled rheological fluid depends on the fluence.

At high fluences, a significant amount of the fluid is evaporated, creating a large vapor pocket. This pocket causes a plume of fluid to be propelled. The plume is wider than the area exposed to the laser energy 14 and can take the form of particles, droplets, or strands. The plume also moves at a high velocity. Lowering the fluence causes a smaller vapor pocket and a narrower and slower plume.

When the fluence is further reduced to values slightly greater than the threshold value, there is a lateral collapse of the plume into a jet of fluid. The jet can be narrower than the area exposed to the laser energy 14. Also, the plume moves at its slowest, and there are fewer particles.

FIGS. 6a–e schematically illustrate some of the possible morphologies of the exposed rheological fluid. These morphologies may be produced with progressively lower fluences from FIGS. 6a to 6e. FIG. 6a shows a very wide plume 64. Some of the rheological fluid is broken up into particles. This may result in a large voxel, possibly containing voids. FIG. 6b shows a more contained, but still wide plume 64. This plume 64 may also produce a large voxel, but us less likely to contain voids. FIG. 6c shows an even smaller plume 64, but the plume 64 is still larger than the area exposed to the laser energy. FIG. 6d shows a jet 66. The jet is smaller than the exposed area and may produce a voxel that is also smaller than the exposed area. FIG. 6e shows a bulge 68 that results when the fluence is too low to transfer any rheological fluid.

Determining the proper laser parameters for a given coating of rheological fluid may be performed using the apparatus described in Example 1. The apparatus takes pictures of the plume at a series of times after the exposure. The pictures are then examined for jetting behavior. If none is present, the laser parameters can be altered and a new series of pictures taken. The parameters can also be determined by examining the voxels that are produced using different parameters. The smallest voxels would be produced by jetting behavior.

Substrates

The laser-transparent support 15 is typically planar, having a support surface 32 in contact with the coating 16 and a rear surface 30 that is positioned so that the laser energy 14 can be directed through the laser-transparent support 15. The composition of the laser-transparent support 15 is selected in accordance with the particular type of laser 12 that is used. For example, if the laser 12 is a pulsed UV laser, the laser-transparent support 15 may be an UV-transparent material including but not limited to quartz or machine-etched quartz. If the laser 12 is an IR laser, the laser-transparent support 15 may be an IR-transparent material including, but not limited to plastic, silicon, fused silica, or sapphire. Similarly, if the laser 12 is a visible laser, the laser-transparent support 15 may be a material that is transparent in the visible range, including, but not limited to soda lime and borosilicate glasses. Other suitable laser-transparent supports include, but are not limited to, germanium, selenides, fluorides, chlorides, tellurides, bromides, iodides, sulphides, and period II–VI compounds. A laser-transparent flexible polymer ribbon can also be a suitable laser-transparent support 15.

The coating 16 can be coated on the laser-transparent support 15 by numerous techniques, including but not limited to spin coating, spray coating, dipping, doctor blading, roller coating, and screen-printing. The surface of the target substrate 17 can be broken into separate regions with different coatings 16 in order to be able to deposit different rheological fluids without having to change the target substrate 17. Typical coatings 16 have uniform thickness and are from about 1 to about 20 microns thick.

The receiving substrate 18 can be any solid material, planar or non-planar, onto which one may wish to deposit the rheological fluid.

Coating

One important element for this method is the choice of coating 16 on the target substrate 17. Preferably, the coating 16 comprises paste, gel, or ink. The pastes, gels, or inks are homogeneous mixtures comprising one or more of the following: functional materials, solvent or vehicle, chemical and rheology precursors, binders, surfactants, dispersant agents, powders, and biomaterials.

Typically, the functional materials can consist of powders ranging in size from about 10 nanometers to about 10 microns and are responsible for the electrical, magnetic, actuating, or sensing properties of the deposit 26 or processed deposit. A functional material, as used in this invention, is a material that possesses an intrinsic property or properties integral to the proper functioning of any variation or combination of an active electronics, magnetic, optical, chemical, biological, actuating, or metrological application. Its properties are sensitive to chemical purity, physical structure, and surface morphology. Because these intrinsic properties of the functional material must be preserved as much as possible after the transfer, the choice and design of the rheological fluid layer become critical in the success of any final application. The properties of the functional materials can be adjusted or enhanced by the use of chemical precursors. In order to preserve a homogeneously dispersed mixture of powders of different types and sizes and various chemical precursors, appropriate organic vehicles, solvents, and binders can be used. Organic vehicles, solvents, and binders can also be used to tailor the rheological properties.

Examples of powders include metals, ceramics, cermets, dielectrics, ferroelectrics, piezoelectrics, femtes, electro-optical and optical materials, ceramic superconductors, chalcogenides, carbides, silicides, nitrides, borides, semiconductors, polymers, conductive polymers, semiconductive polymers, electroluminescent polymers, biomaterials, and composites. Examples of chemical precursors include metal organic precursors, hydrated metal alkoxides, and organometallic compounds. Examples of vehicles include organic solvents with low vapor pressures such as glycerin, ethylene glycol, terpineol, butyl carbitol, butyl carbitol acetate, propylene carbonate, and 1-methyl-2-pyrrolidinone. Examples of binders include ethyl and other types of cellulose, polymethyl methacrylate (PMMA), glass frit, and poly(vinylidene fluoride). Examples of dispersants include various soaps, menhaden fish oil, and phosphate ester oligomers. The organic solvents used as vehicles can have low vapor pressures in order to minimize their evaporation while the paste, gel, or ink resides in the target substrate, in order to avoid changes in the viscosity and rheology of the mixture. However, it is typically necessary that once the pastes, gels, or inks have been laser transferred, the vehicle can be removed either thermally or photothermally without contaminating or influencing the chemistry of the functional material and chemical precursors. Finally, temporary and/or permanent binders can also be added to the pastes. Temporary binders, such as ethyl cellulose, are used to improve the rheology of the pastes, gels, or inks. Once the pastes, gels, or inks have been transferred, the binders may be thermally or photothermally decomposed without contaminating the functional material. Permanent binders, such as glass frit, are used to bind the functional materials together and to the receiving substrate. The permanent binder might require higher temperatures for melting (>300° C.) and remains part of the transferred material after sintering. The previous examples are not intended to limit the scope of the invention.

The resulting pastes, gels, or inks can have a wide range of viscosities, i.e. water-like to thick paste-like, which can be tailored depending on the nature of the paste and the technique used to coat the target substrate. Typical viscosities are in the range of about 0.01 to about 100,000 cPs. The specific rheological properties of the fluid, such as viscosity, vapor pressure, polarizability, shear resistance, slippage, thixotropicity, etc., can have a strong effect on the transfer characteristics. These properties are not necessarily permanently modified during the transfer process. Although these properties may be temporarily modified during the transfer process, the changes in properties are predictable. Therefore they can be tailored for a specific application or to achieve the desired final properties of the transferred material.

Once transferred, the fluids can be treated, if necessary, using appropriate thermal, photothermal, or photolytic processes, resulting in materials that exhibit near bulk-like properties and are suitable for electronic, actuator, and sensing applications, among others. Once the paste, gel, or ink has been laser transferred, the vehicle and temporary binders can be removed by thermally or photothermally heating the receiving substrate 18 to moderate temperatures (i.e. 100 to 250° C.). After this initial drying step, the transferred material can be heated to higher temperatures (i.e. >250° C.) by the use of lasers or rapid thermal annealing treatments. This final step allows for the decomposition of the chemical precursors, while consolidating or densifying the functional materials and any permanent binders present, with little or no heating of the adjacent receiving substrate. Since the pastes, gels, or inks typically contain a high percentage by weight of functional materials in powder or other solid forms, this technique allows a dramatic increase in the mass of the material being transferred per laser energy exposure if compared to other laser forward transfer direct-write techniques such as LIFT. As a consequence, this invention allows for the transfer of material at relatively high rates when used with fast firing lasers, resulting in high writing speeds (over 100 mm/sec) which is very important for its use not only in prototyping but also in manufacturing environments.

The method of the invention is compatible with a broad variety of classes of materials. Furthermore, given the broad range of parameters offered by varying both the rheological properties of the fluid and the laser wavelength and fluence, it is possible to deposit materials with properties not available with any other currently available technique. For electronic applications, the transfer of pastes, gels, or inks with tailored rheological properties can be used to enhance the packing density, minimize spreading, i.e. increase resolution and improve the surface morphology of the resulting features, with the resulting gain in electronic properties. The use of a rheological fluid also allows the addition of adhesion promoters, binders, and agents that would improve the durability and reliability of the electronics components. In addition, the laser forward transfer of a rheological fluid more easily allows the transfer and deposition of materials on conformal (i.e. non-planar) surfaces. The rheological properties of the transferred fluid lend easily to coalescent behavior which gives rise to the unique properties and advantages of this invention.

Having described the invention, the following examples are given to illustrate specific applications of the invention. These specific examples are not intended to limit the scope of the invention described in this application.

EXAMPLE 1

Figure 5:
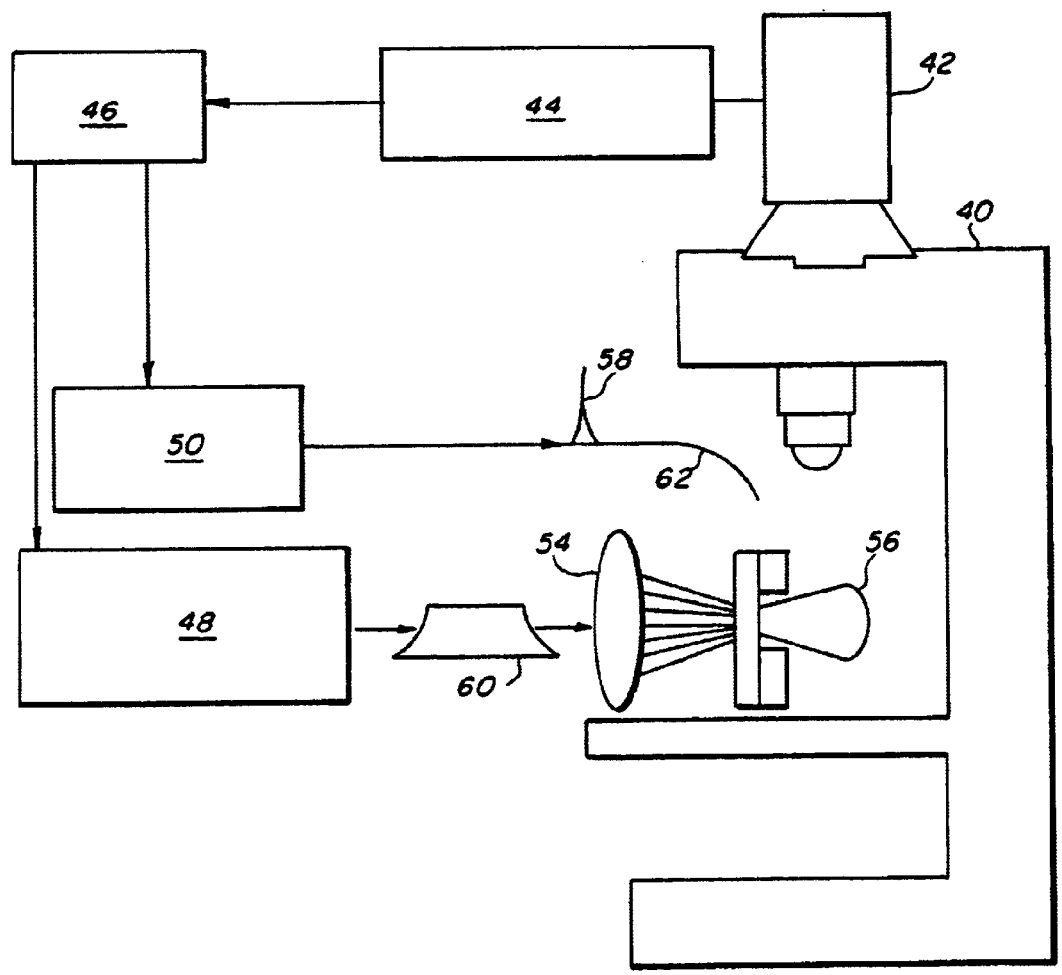
FIG. 5 is a schematic representation of the apparatus of Example 4, which is used to take photographs of the plume of rheological fluid as it is propelled away from the target substrate.

Microscopy and Jetting Regime—Ultrafast microscopy was used to study the dynamics of the MAPLE-DW process and the laser-fluid interaction. The apparatus is schematically represented in FIG. 5. The ink used in this demonstration was composed of a solid phase (barium zirconium titanate powder, BZT, Cabot R919H), dispersed in (x-terpineol. A thick film was formed on a quartz laser-transparent support using a wire-coater (Gardner Co. #3) to produce a stable homogeneous layer 5 to 10 $\mu$m thick.

An ultrafast microscope was used to study the MAPLE-DW transfer events. A charge coupled device (CCD) camera and computer/frame-grabber combination triggered a variable-delay generator, which fired a 150 ns, 355 nm frequency-tripled Nd:YAG transfer laser and a 600 ps, 500 nm $N_2$/Dye strobe illumination laser. A pulse-slicer was used to reduce the pulse to 30 ns by selecting the most intense portion of the 150 ns pulse. The transfer laser pulse was focused through the laser-transparent support, onto the ink coating, to 70 $\mu$m diameter, with a nominal fluence (averaged over the roughly Gaussian beam profile) that ranged from 0.065 to 0.65 J/cm 2. The microscope objective was focused at the intersection of the transfer pulse and the ink layer, and the image was illuminated by the strobe laser pulse to produce a single image frame captured by the CCD and computer. One image at each time delay was selected to generate a reconstructed stop-action movie of the transfer dynamics. To assure that each image was truly representative, at least three images were examined at each delay setting. The microscope was arranged at two different configurations to view the ink layer either from the top or from the side. A series of images of the time evolution of the rheological fluid-laser interaction were recorded at different laser fluences.

At 0.62 J/cm² fluence, the plume formed immediately. Even before the laser pulse had ended (25 ns) there was a substantial plume evident. Magnification of the image at 25 ns showed fine structure in the plume, of a length scale that is visible in the optical micrograph. This indicates that the material in the plume is a fluid rather than a vapor. The fluid took the form of particles, droplets, and strands.

As time progressed, the plume expanded and traveled further off the quartz support (normal direction), and also expanded in the plane of the fluid layer (lateral direction). After 200 ns, the images did not show the entire structure, but the geometry of the plume changed monotonically enough to infer the growth behavior. The expansion continued until approximately 1000 ns, after which there were changes in the plume shape. The plume appeared to develop a "waist" and become narrower. This waist became pronounced between 1500 ns and 2000 ns, and there was some visual evidence that the waist initially developed close to the fluid layer, then propagated outwards. After 3000 ns the transfer appeared to be mostly complete, and later images showed only some low velocity particles that appeared to originate from the edges of the hole in the fluid layer.

The fluid plume formations at 0.52 and 0.39 J/cm² were very similar to that at 0.62 J/cm². Direct comparison between these fluences at similar times showed plumes that propagated slightly slower. Both outward and lateral plume expansion occurred slower. Regardless of the change in plume front velocity, the plume narrowing appeared to still begin at 1500 ns to 2000 ns, after which the material transfer began to peter out.

At 0.26, 0.13, and 0.065 J/cm², decreasing laser power still resulted in slower normal and lateral plume expansion. Even though the plume expanded less distance, the initial expansion still lasted only approximately 1000 ns, after which plume waist formation began. At these fluences, the waist formation was much more pronounced than at higher fluences. At 0.065 J/cm², the waist that forms at 1500 ns became highly pronounced, and the extension of the plume waist in the normal direction was obvious. As with the higher fluences, the waist formation appeared to signal the end of the material transfer, with only debris evident after 5000 ns.

Jetting behavior was observed at 0.039, 0.032, and 0.026 J/cm². At these fluences, the plume expanded both normally and laterally until approximately 1000 ns to 1500 ns. This behavior was still similar to that at higher fluences, with a continuing reduction in the expansion rate as laser fluence was reduced. However, at longer times the plume appeared to experience a drastic reduction in lateral width, termed a lateral collapse. This lateral collapse occurred concomitant with further normal propagation of fluid, and at times after 2000 ns the material appears to have formed into a jet of liquid. The width of this liquid was under 20 μm, significantly smaller than the beam spot itself. At 0.039 and 0.032 J/cm², this jet lasted until 5000 ns after the laser impulse, and at 0.026 J/cm² the jet was observed until 15000 ns. Note that these times were much past when the primary material transfer was over at higher fluences. At 0.039 and 0.032 J/cm² the jet appeared to be composed of strands or filaments of liquid, but the material at 0.026 J/cm² appeared to be formed into a single continuous jet that propagated smoothly off the fluid layer until breakup. At longer times, the jets at all three fluences appeared to break up into particles that continued to travel off the substrate.

This jetting behavior occurred over a relatively small range of laser fluence, and the image series showed more shot-to-shot variation than the image series at higher fluences.

At 0.013 and 0.019 J/cm² sub-threshold behavior was observed. At times up to 1000 ns after the laser pulse, the fluid initial behavior at these fluences was still geometrically similar to that at higher fluences, but the expansion rate of the liquid was drastically reduced. The primary difference is that the fluid that was propelled off the original layer did not detach after 1000 ns. Instead of the material detaching and propagating away from the fluid layer, the behavior at these fluences resembles the creation of a bulge in the fluid layer. This bulge grew in size initially, and even took on a peaked shape resembling the jets that formed at slightly higher fluences. However, the bulge collapsed subsequently.

Although the images were recorded without a receiving substrate adjacent to the target substrate, the jetting behavior clearly suggests that features smaller than the initial laser focal spot area could be direct-written onto a receiving substrate by choosing the appropriate laser fluence, rheological fluid layer properties, and target-to-substrate distance.

EXAMPLE 2

Biomaterials—In this example, the jetting transfer of a biomaterial was studied. Ultrafast transfer images were correlated with post-transfer results to show the unique effect of jetting on deposition results. In this example, the target substrate was first prepared by sputtering a metallic absorption layer of Cr (10 nm)/Au (100 nm) onto an optically flat quartz disc. The disc was then coated with a bovine serum albumin (BSA) solution by dispensing 10 μL of the solution onto the metal-coated surface, and manually spreading the solution to cover a 1 cm² area. Finally, the sample was spun at 500 RPM for 30 seconds to homogenize the layer. The final result was a homogeneous fluid layer with 10 microns thickness. The layer was visually homogeneous across the entire sample, excepting the edges.

The transfer and imaging were performed as described in Example 1. It was noted that the high reflectivity of the metal layer and transparency of the protein solution caused the background field of these images to be dark, and the air-solution interface was not evident until material transfer disturbs the geometry. However, the visual contrast between the image background and the transferred material is pronounced.

At high fluences (0.078 J/cm²), significant vaporization and fluid deformation occurred at 75 ns, and by 150 ns there was a distinct neck formed between the droplet or bubble of fluid and the original layer. Fluid continued to propagate and around 1000 ns the neck appeared to pinch off, and the majority of the detached protein solution then propagated out of the view of the camera (250 microns from original position). At lower fluences (0.026 J/cm²) jetting behavior was observed. The initial fluid deformation was relatively slow, as compared to plume fluences. Formation of a bubble took approximately 500 ns, but by 1000 ns this bubble appeared to laterally collapse into a thin jet of fluid. This jet reached long distances from the target substrate before breaking up into small droplets, which occurred after 10,000 ns. Finally, sub-threshold behavior occurred at lower fluences where there was insufficient energy to detach any liquid from the original layer. Formation of a vapor bubble was still visible at these fluences, but the expansion reached a maximum around 3000 ns and then contracted.

The dynamics of laser-transferred fluid as it leaves the target substrate is only half of the entire process—The impact and interaction of this material with the receiving substrate can also have a strong effect on the final results, as well. A series of post-transfer studies was performed in order to observe the effects of the substrate, and also to allow correlation of transfer results with the dynamics that were observed in high-speed imaging. The same Cr/Au coated quartz plates and protein solution was used as in the imaging studies presented above. In order to minimize shot-to-shot variation and inhomogeneities in target substrate preparation, the entire experiment was done with an automated laser rapid prototyping system, and complete experiments were performed on a single 1×1 cm$^2$ area of target and receiving substrates. Laser fluence and target to receiving-substrate separation were systematically varied, and the areas of the resulting pixels were measured. This study determined that the resulting pixel area of BSA solution is primarily determined by the laser fluence, and is only weakly dependent on the target to receiving-substrate separation. A fluence of 0.087 J/cm$^2$ produced droplets with an average diameter of approximately 55 microns, while 0.055 J/cm$^2$ resulted in a diameter of approximately 23 microns. These diameters are substantially less than the diameter of the original laser spot. The results of these transfers appear to be quite insensitive to target to receiving substrate separation distance. For example, the separation-dependent spread in pixel areas at 0.087 J/Cm$^2$ is from a diameter of 55 μm at 60 μm separation to a diameter of 62 μm at 140 μm separation. At the lowest fluence where transfer was observed (0.055 J/cm$^2$), there was no observable separation-dependent change in the written pixel area, above statistical variation due to laser jitter. The threshold fluence was measured as 0.052 J/cm$^2$, below which no transferred material was observed.

We claim:

1. A method for laser deposition comprising the steps of:
   providing a receiving substrate;
   providing a target substrate;
      wherein a gap exists between the receiving substrate and the target substrate;
      wherein the target substrate comprises a laser-transparent support coated with a coating on a surface facing the receiving substrate; and
   exposing the coating to laser energy through the laser-transparent support at a defined target location comprising a rheological fluid to evaporate a portion of the rheological fluid adjacent to the laser-transparent support at the defined target location;
      wherein the laser energy has a laser fluence that is chosen to cause jetting behavior in the non-evaporated rheological fluid;
      wherein the non-evaporated rheological fluid at the defined target location is propelled by the evaporated rheological fluid away from the laser-transparent support and toward the receiving substrate; and
      wherein the non-evaporated rheological fluid is deposited at a defined receiving location on the receiving substrate to form a deposit.

2. The method of claim 1, wherein the laser fluence is at about, but not less than, the amount required to cause the non-evaporated rheological fluid to be propelled away from the laser-transparent support.

3. The method of claim 1, wherein the deposit on the receiving substrate is smaller than the area of the laser energy incident on the target substrate.

4. The method of claim 1, wherein the method is controlled by a computer.

5. The method of claim 1,
   wherein the steps are carried out at about room temperature; and
   wherein the steps are carried out at about atmospheric pressure.

6. The method of claim 1, wherein the laser is selected from the group consisting of a pulsed laser and a continuous wave laser.

7. The method of claim 1, wherein laser energy is focused through an objective or lens.

8. The method of claim 1,
   wherein the step of exposing the coating is repeated at successive defined target locations and successive defined receiving locations; and
   wherein the deposit is in a two-dimensional pattern or a three-dimensional pattern.

9. The method of claim 1,
   wherein the step of providing a target substrate is performed one or more times:
   wherein the target substrates comprise at least two different coatings; and
   wherein different rheological fluids obtained from the different coatings are deposited in respective patterns on the receiving substrate.

10. The method of claim 1, wherein the laser-transparent support comprises one or more materials selected from the group consisting of fused silica, quartz, machine-etched quartz, sapphire, soda lime glass, borosilicate glass, silicon, germanium, selenides, fluorides, chlorides, tellurides, bromides, iodides, sulphides, period II–VI compounds, and plastic.

11. The method of claim 1, wherein the laser-transparent support comprises a laser-transparent flexible polymer ribbon.

12. The method of claim 1, wherein the receiving substrate comprises a non-planar surface.

13. The method of claim 1, wherein the rheological fluid is in a form selected from the group consisting of paste, gel, ink, concentrated solutions, suspensions, Newtonian fluids, non-Newtonian fluids, viscoelastic fluids, and elasticoviscous fluids.

14. The method of claim 1, wherein the coating comprises one or more materials selected from the group consisting of metals, ceramics, cermets, dielectrics, ferroelectrics, piezoelectrics, ferrites, electro-optical materials, optical materials, ceramic superconductors, chalcogenides, carbides, silicides, nitrides, borides, semiconductors, polymers, conductive polymers, semiconductive polymers, electroluminescent polymers, biomaterials, and composites.

15. The method of claim 1, wherein the coating comprises one or more materials selected from the group consisting of metal organic precursors, hydrated metal alkoxides, and organometallic compounds.

16. The method of claim 1, wherein the coating comprises one or more materials selected from the group consisting of glycerin, ethylene glycol, terpineol, butyl carbitol, butyl carbitol acetate, propylene carbonate and 1-methyl-2-pyrrolidinone.

17. The method of claim 1, wherein the coating comprises one or more materials selected from the group consisting of ethyl cellulose, cellulose compounds, polymethyl methacrylates, poly(vinylidene fluoride), and glass frit.

18. The method of claim 1, wherein the coating comprises one or more materials selected from the group consisting of soaps, menhaden fish oil, and phosphate ester oligomers.

19. The method of claim 1 comprising the following additional step;

exposing the deposit to laser energy;
wherein laser energy alters the properties of the deposit.

20. The method of claim 19, wherein one laser is used to transfer the rheological fluid, and a different laser is used to expose the deposit.

21. The method of claim 1 comprising the following additional step:

exposing the receiving substrate to laser energy to machine away a defined machining location on the deposit.

22. The method of claim 21, wherein the defined machining location comprises a structure selected from the group consisting of a via through the receiving substrate, a trench on or through the receiving substrate, an elevated feature on the receiving substrate, and a depressed feature on or through the receiving substrate.

23. The method of claim 1, wherein the coating comprises one or more materials selected from the group consisting of functional materials, solvents, vehicles, chemical precursors, rheology precursors, binders, surfactants, dispersants, powders, and biomaterials.

24. The method of claim 23, wherein the functional material comprises one or more materials that possess an intrinsic property or properties integral to the proper functioning of any variation or combination of an active electronics, magnetic, optical, chemical, biological, actuating, or metrological application.

25. The method of claim 1 comprising the following additional step:

exposing the receiving substrate to laser energy to machine away a defined machining location on the receiving substrate.

26. The method of claim 25, wherein the defined machining location comprises a structure selected from the group consisting of a via through the receiving substrate, a trench on or through the receiving substrate, an elevated feature on the receiving substrate, and a depressed feature on or through the receiving substrate.

27. The method of claim 25, wherein the rheological fluid is deposited into the defined machining location.

28. The method of claim 1 comprising the following additional step:

exposing the coating to laser energy through the laser-transparent support at the defined target location comprising a rheology precursor such that the rheology precursor is converted to the rheological fluid.

29. The method of claim 28, wherein the rheology precursor is material whose initiation, degree, and duration of desired rheological properties can be activated by an external stimulus.

30. The method of claim 28, wherein the rheology precursor is a primary component of the coating.

31. The method of claim 28, wherein one laser is used to convert the rheology precursor to the rheological fluid, and a different laser is used to transfer the rheological fluid.

* * * * *